United States Patent [19]

Yokoyama et al.

[11] Patent Number: 5,198,660
[45] Date of Patent: Mar. 30, 1993

[54] OPTICAL SENSING CIRCUIT INCLUDING AN INTEGRAL CAPACITY

[75] Inventors: Shotaro Yokoyama; Takashi Nishibe, both of Kawasaki, Japan

[73] Assignee: Fuji Electric Co., Ltd., Kawasaki, Japan

[21] Appl. No.: 750,638

[22] Filed: Aug. 27, 1991

[30] Foreign Application Priority Data

Aug. 30, 1990 [JP] Japan .................................. 2-230289
Dec. 3, 1990 [JP] Japan .................................. 2-400175
Mar. 13, 1991 [JP] Japan .................................. 3-48157

[51] Int. Cl.$^5$ ............................................. H01J 40/14
[52] U.S. Cl. .................................. 250/214 A; 307/311
[58] Field of Search ........... 250/214 A, 214 R, 214 C, 250/211 J, 211 R; 307/311, 494; 330/59, 308, 293, 294, 107; 328/128

[56] References Cited

U.S. PATENT DOCUMENTS

| | | | |
|---|---|---|---|
| 4,165,471 | 8/1979 | Ahrenkeil | 307/311 |
| 4,459,475 | 7/1984 | Flint et al. | 250/214 A |
| 4,743,856 | 5/1988 | Keating | 307/311 |
| 4,789,777 | 12/1988 | Takami et al. | 250/214 A |

Primary Examiner—David C. Nelms
Assistant Examiner—K. Shami
Attorney, Agent, or Firm—Spencer, Frank & Schneider

[57] ABSTRACT

An optical sensing circuit having a photodiode, a differential amplifying circuit, and a comparator. The differential amplifying circuit is provided with an integral capacity. Adjusting capacities are connected in parallel to or disconnected from the integral capacity. A composite capacitance of the integral capacity and the adjusting capacities is adjusted by a control circuit so that the composite capacitance increases with increase of light intensity. This makes it possible to improve sensitivity of the optical sensing circuit for the light intensity and to widen the dynamic range for light sensitivity.

6 Claims, 11 Drawing Sheets

OPTICAL SENSING CIRCUIT INCLUDING AN INTEGRAL CAPACITY

BACKGROUND OF THE INVENTION

1. Field of the Invention

The present invention relates to an optical sensing circuit for an optical detecting portion or the like of an integrated circuit for automatic focusing of a camera, and more particularly to a technique for converting a photoelectric current in a photodiode into a varying voltage and for detecting the intensity of light by using this voltage variation.

2. Description of the Prior Art

Figure 1:
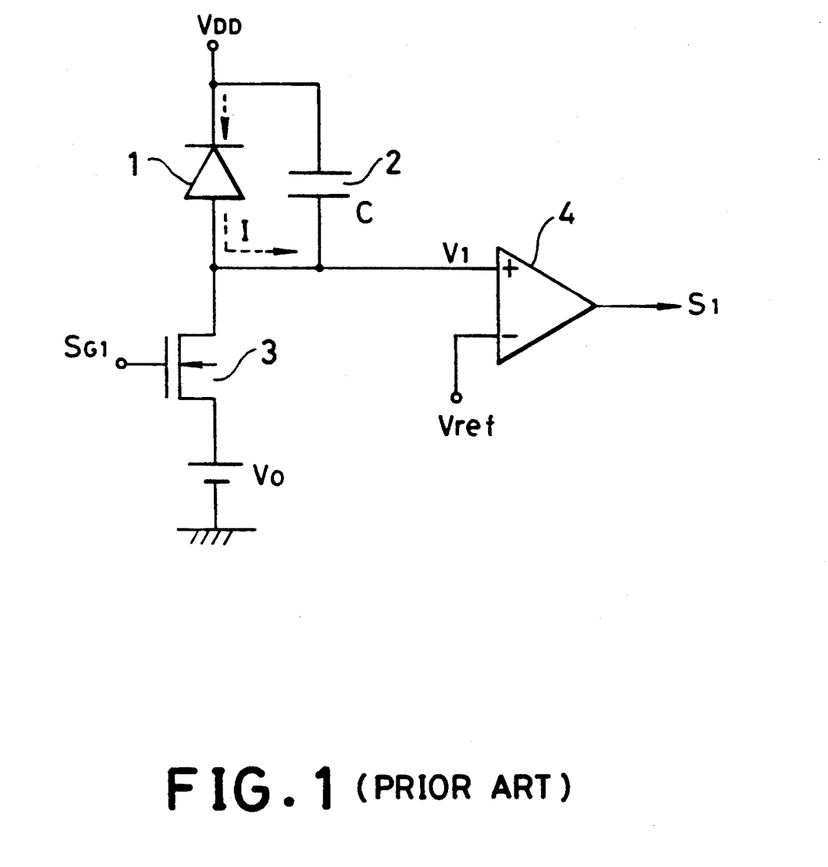
FIG. 1 is a circuit diagram showing a conventional optical sensing circuit.

A conventional optical sensing circuit is shown as an example in FIG. 1. The circuit comprises a photodiode 1 as a photoelectric current detecting means, a reset transistor 3 as a voltage setting means, and a comparator 4 as a voltage comparing means. One electrode of the photodiode 1 (cathode) is connected to a power source voltage $V_{DD}$, and the other electrode thereof (anode) is connected to an initial voltage $V_0$ via the reset transistor 3 and is connected to the comparator 4.

Figure 2:
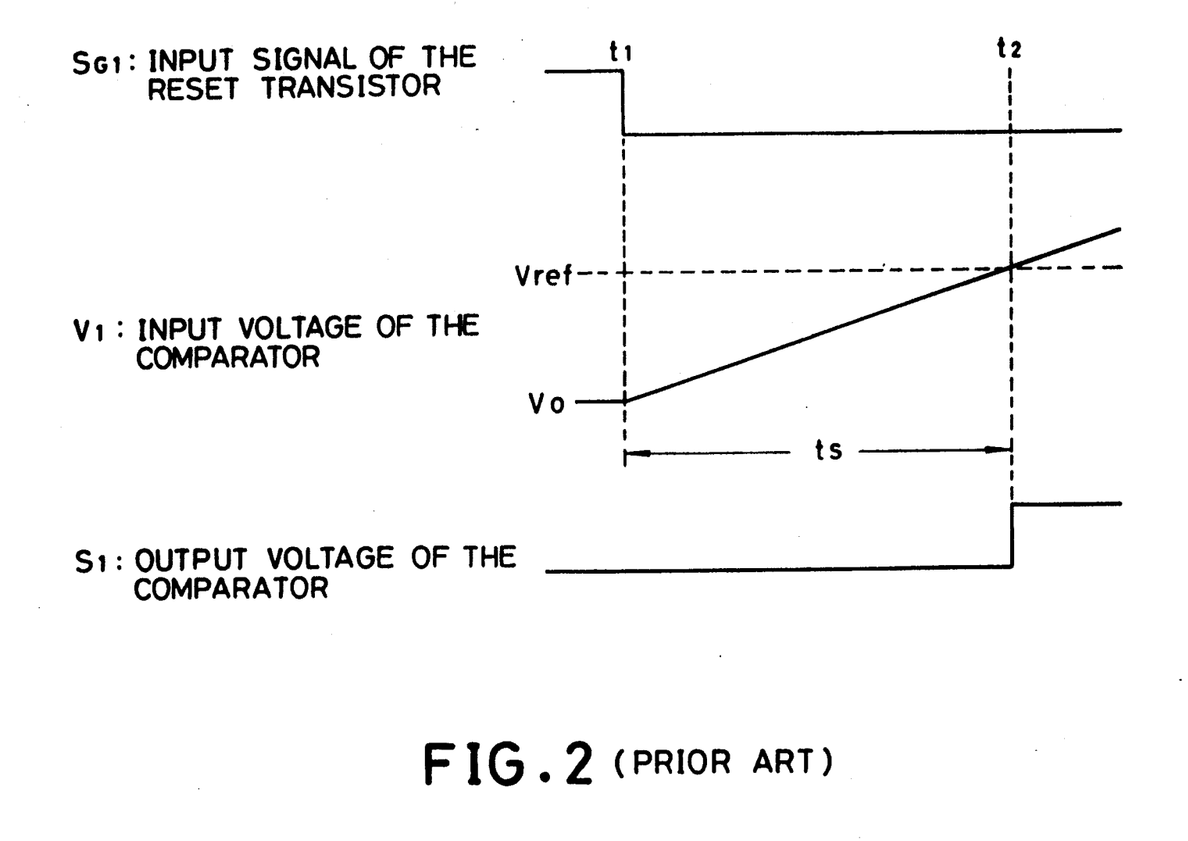
FIG. 2 is a timing chart showing the operation of the conventional optical sensing circuit.

In this optical sensing circuit, when the reset transistor 3 is turned on, the anode of the photodiode 1 is set to the initial voltage $V_0$, and a reverse biased voltage $(V_{DD}-V_0)$ is applied to the photodiode 1. As shown in FIG. 2, when an input signal $S_{G1}$ is switched from level H to level L and the reset transistor 3 is cut off, a photoelectric current I flows from the power voltage source to the anode of the photodiode 1 according to the intensity of light irradiated onto the photodiode 1. This causes an equivalent capacity 2 to be discharged, the equivalent capacity being composed of a junction capacity of the photodiode 1, a drain capacity of the reset transistor 3, an input capacity of the comparator 4, and the like. During this discharge, the input voltage of the comparator 4 increases according to the following expression (1):

$$V = V_0 + I \cdot t / C \quad (1)$$

where, C is the capacitance of the equivalent capacity 2, t is the time passing from the time when the reset transistor 3 is cut off, and the equivalent capacity 2 functions as an integral capacity of a current-to-voltage converting means for converting of photoelectric current into a voltage.

If the input voltage rises according to expression (1) described above and exceeds a reference voltage $V_{ref}$, the output voltage of the comparator 4 is inverted as shown in FIG. 2. The time $t_s$, between the switching time of the input signal and the time when the output voltage of the comparator 4 is inverted (referred to below as the reverse time period $t_s$), has the following relationship (2) with the photoelectric current I:

$$t_s = (V_{ref} - V_0) \cdot C / I \ldots \quad (2)$$

Consequently, the magnitude of the photoelectric current, or the intensity of light irradiated onto the photodiode 1 can be detected by measuring the reverse time period $t_s$.

In order to improve in the sensitivity of the above conventional optical sensing circuit, there are three methods, (1) decreasing the value of $(V_{ref}-V_O)$, (2) decreasing the capacitance C of the equivalent capacity 2, and (3) increasing the photoelectric current I.

However, If the value of $(V_{ref}-V_O)$ is decreased to a small value, unevenness of the light sensitivity is increased due to an offset voltage of the comparator 4. This makes it difficult to obtain uniform sensitivity characteristics. With regard to the method (2) which tries to reduce the capacitance C of the equivalent capacity 2, the capacitance C is affected by the total capacity of the junction capacity of the photodiode 1, the drain capacity of the reset transistor 3 and the input capacity of the comparator 4. This will cause not only unevenness of the capacitance but also a reduction of the SN ratio of the photodiode 1. These problems are particularly conspicuous when the junction capacitance is decreased. Therefore, the minimum value of the capacitance C is restricted.

Moreover, in the method (3) which tries to increase the photoelectric current I, an improvement in a conversion efficiency of the photodiode 1 is restricted. This makes it difficult to obtain the conversion efficiency higher than the conventional one. In other words, it is very difficult to improve the light sensitivity of the conventional optical sensing circuit by using any one of the above methods (1) to (3).

In addition, the switching noise of the reset transistor 3 or the like will induce fluctuations of the initial voltage $V_O$. As a result, the accuracy of the intensity of light obtained by using the reverse time period $t_s$ deteriorates.

Furthermore, even if the improvement in the sensitivity for the light intensity in a predetermined range is achieved by using the above methods, the dynamic range for the light intensity is restricted. The reason is that if the intensity of light is large and far beyond the range, the reverse time period $t_s$ shown in expression (2) becomes small and the resolution of the light intensity is decreased.

SUMMARY OF THE INVENTION

Therefore, it is an object of the present invention to achieve a high sensitive optical or photo sensing circuit where the junction capacity of the photodiode does not work as an integral capacity.

It is another object of the present invention to provide an optical sensing circuit that can achieve a high accuracy light intensity measurement by providing another initialization means so that the input voltage of the comparator may not directly depend on the initial voltage.

It is still another object of the present invention to provide an optical sensing circuit that can enlarge the dynamic range of the light intensity by making the value of the integral capacity a variable.

According to a first aspect of the present invention, there is provided an optical sensing circuit comprising photoelectric current generating means, current-to-voltage converting means for converting an output current of the photoelectric current generating means into a voltage, voltage comparing means for comparing an output voltage of the current-to-voltage converting means, and voltage setting means for initializing the output voltage of the current-to-voltage converting means. The optical sensing circuit detects the intensity of light irradiated onto the photoelectric generating means by using a variation rate of the output voltage of the current-to-voltage converting means. In order to solve the above problems, the present invention provides first means and second means as discussed below:

As the first means, the current-to-voltage converting means may comprise a differential amplifying circuit, which is fed with the output of the photoelectric current generating means as an input thereto and functions for a predetermined reference voltage, and an integral capacity connected between the input and the output terminals of the differential amplifying circuit in parallel. The voltage setting means is switching means for connecting or disconnecting between the input and output terminals of the differential amplifying circuit.

As the second means, a transfer capacity is inserted between the output of the current-to-voltage converting means and the input of the voltage comparing means, and voltage setting means for initializing an input voltage of the voltage comparing means is provided.

Both the first means and the second means described above are preferably provided at the same time.

In addition to the means described above, the integral capacity is composed of a circuit, in which at least one reference capacity and a plurality of adjusting capacities to be connected or disconnected, are connected in parallel.

In this case, there is preferably provided control means, which checks whether or not the intensity of light is measured again based on the variation rate of the output voltage of the current-to-voltage converting means. When the light intensity is measured again, there is preferably provided a control means for changing the composite integral capacitance by connecting or disconnecting a plurality of the adjusting capacities.

Moreover, there is preferably provided the voltage variation limiting means for limiting an initial variation of the output voltage of the differential amplifying circuit immediately after the switching means is cut off. For this purpose, a diode is preferably connected across the differential amplifying circuit so that a reverse-biased voltage may be applied to the diode when an integral action is being performed. In this case, the switching means is preferably composed of a transistor element, where a second region (e.g., a drain region) and a third region (e.g., a source region) of a first conductivity type semiconductor (e.g., N+ type) are formed in a surface of a first region of a second conductivity type semiconductor (e.g., P type) and a channel is formed inside a surface of the first region between the second region and the third region, the integral capacity is preferably made between the first region and an electrode layer formed on the surface thereof via an insulating layer, and the diode is preferably composed of a junction between the first region and the second region.

According to the present invention, the anode voltage of the photoelectric current generating means is applied to one input terminal of the differential amplifying circuit, and a predetermined reference voltage is also applied to the other input terminal of the differential amplifying circuit. The differential amplifying circuit produces a voltage based on the difference between the above two voltages. Since the capacity and the switching means are connected between the input and the output of the differential amplifying circuit, the differential amplifying circuit and the capacity forms an integral circuit when the switching means is cut off. Therefore, an integral value produced by the photoelectric current generating means can be obtained as the output voltage of the differential amplifying circuit. On the other hand, when the switching means is turned on, the output voltage of the differential amplifying circuit accords with the input voltage thereof, and the output voltage is set to the reference voltage again.

In the circuit, since the differential amplifying circuit always tends to function so as to equalize the input voltage with the reference voltage, even when an integral action performed during the switching means is cut off, the input voltage of the differential amplifying circuit is always equal to the reference voltage. Thus, a bias voltage fed to the photoelectric current converting element can be always maintained constant, while the bias voltage always fluctuates when an integral action is performed in the conventional optical sensing circuits. Therefore, the photoelectric current generating means can operate under a constant state, and hence the intensity of light can be detected with high stability and high accuracy.

Additionally, since the constant reverse-biased voltage is applied to the photoelectric current generating means, the junction capacity cannot be charged or discharged by the photoelectric current. Consequently, an integral action is performed only by the capacity connected in parallel to the differential amplifying circuit, regardless of the junction capacity. Thus, the sensitivity of the output voltage of the differential amplifying circuit for the photoelectric current, can be increased by setting the above capacitance to a small value.

Next, the voltage of the current-to-voltage converting means, which varies based on the photoelectric current of the photoelectric current generating means, is inputted to the voltage comparing means via the transfer capacity, and there is provided the voltage setting means for initializing the input voltage of the voltage comparing means. In this case, the voltage setting means holds the input voltage of the voltage comparing means to the initial value until an integral action has begun by cutting off the switching means in the current-to-voltage converting means. After a lapse of a predetermined time, the voltage setting means is cut off so as to release the setting of the above input voltage, and hence the input voltage of the voltage comparing means follows the output voltage of the current-to-voltage converting means via the transfer capacity. Thus, the voltage setting means can initialize the input voltage of the voltage comparing means to the predetermined reference voltage, regardless of a voltage in the previous stage of the transfer capacity.

Therefore, even if switching noise or the like is superimposed on the voltage in the previous stage of the transfer capacity at the start of an integral action, the voltage variation at the beginning of the integral action is not transferred to the input of the voltage comparing means, and only charges or discharges the transfer capacity. Thus, the input voltage transfer to the voltage comparing means begins when the voltage setting means is released. As a result, the sensitivity of light can be obtained with high accuracy and good stability.

Even when the current-to-voltage converting means comprises a differential amplifying circuit having an offset voltage, the initial value of the input voltage to the voltage comparing means is determined only by the voltage set by the voltage setting means regardless of the offset voltage. This can prevent both the degradation of the sensitivity for the light intensity and the occurrence of errors caused by the superimposed offset voltage on the detected value of the photoelectric current. Furthermore, the uniformity of the light sensitivity can be maintained without being affected by the fluctuation of the offset voltage of the differential amplifying circuit.

Moreover, the integral capacity may be composed of a parallel connection of the reference capacity and the adjusting capacities, and the control means is provided for connecting or disconnecting the respective adjusting capacities based on the variation rate of the output voltage of the current-to-voltage converting means. In this case, if the variation rate of the output voltage is appropriate, the intensity of light is detected without changing the capacitance. In contrast, if the variation rate is not appropriate for detecting the light intensity, the adjusting capacities are connected or disconnected by changing the number of adjusting capacities connected to the reference capacity. This enables the composite capacitance of the integral capacity to be changed in order to change the variation rate, and the intensity of light can be measured again by using this appropriate rate. Therefore, wide range light intensity can be detected with higher accuracy and better resolution, and the wider dynamic range of the optical sensing circuit for detecting the light intensity can be obtained.

When the voltage variation limiting means is provided, the variation of the output voltage of the differential amplifying circuit based on the switching noise of the switching means can be restricted, and the operation stability time of the differential amplifying circuit can be shortened. Thus, errors and offset involved in the light intensity measurement can be reduced, and hence the measurement accuracy can be improved. Moreover unevenness of the sensitivity among each measurement and each optical sensing circuit can also be reduced.

As described above, according to the present invention, the output of the photoelectric current generating means is input into the differential amplifying circuit, where the capacity and switching means are connected in parallel between the input and output thereof. Moreover, the voltage generated by the current-to-voltage converting means on the basis of the output current of the photoelectric current generating means, is input via the transfer capacity into the voltage comparing means, in which the voltage setting means for initializing the input voltage thereto is provided. Furthermore, a plurality of the adjusting capacities are provided together with its control means to be connected to or disconnected from the reference capacity in a parallel fashion. The effects are as follows:

An integral action is performed by using only the capacity connected in parallel to the differential amplifying circuit, and hence it is possible to improve the sensitivity of the output voltage for the photoelectric current by setting this capacitance to a small value. The input voltage of the voltage comparing means can be initially set to a predetermined reference voltage by the voltage setting means regardless of the voltage in the previous stage of the transfer capacity. Thus, it is possible not to transmit switching noise to the voltage comparing means, and hence the accuracy in detecting the light intensity can be improved. Since the variation rate of the output voltage can be adjusted based on the light intensity, a wide range light intensity can be detected with high accuracy and better resolution and a wide dynamic range of the optical sensing circuit for the light intensity can be obtained. The voltage variation limiting means enables the error and the offset in the measurement of the light intensity to be decreased and the measurement accuracy to be improved. In addition, unevenness of the light sensitivity among each measurement and each optical sensing circuit can be reduced. In this case, when the switching means and the integral capacity are formed on a common region of a semiconductor element in parallel, a diode can be used as the voltage variation limiting means, which realizes a high performance optical sensing circuit with a low cost and a small area.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Referring to the accompanying drawings, embodiments of the optical sensing circuits of the present invention are described below.

Embodiment 1

Figure 3:
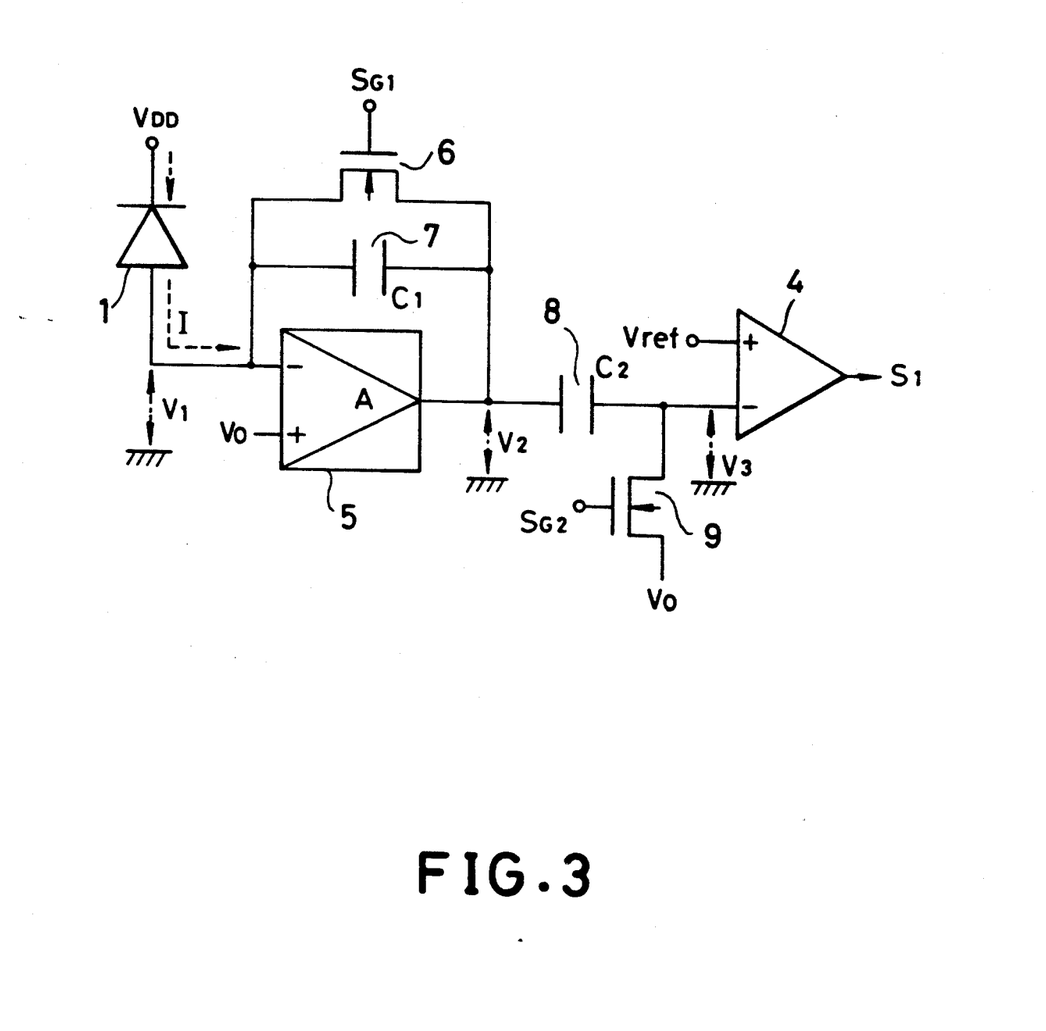
FIG. 3 is a circuit diagram showing Embodiment 1 of the optical sensing circuit of the present invention.

The configuration of Embodiment 1 is shown in FIG. 3. In this circuit, the cathode electrode of a photodiode 1 is connected to the power source voltage $V_{DD}$, and the anode electrode of the photodiode 1 is connected to the inverting terminal of a differential amplifying circuit 5. A first reset transistor 6 and an integral capacity 7 are connected in parallel between the inverting terminal and the output terminal of the amplifying circuit 5. The differential amplifying circuit 5 is applied with a reference voltage $V_0$ at the non-inverting terminal, and with the voltage $V_1$ of the anode of the photodiode 1. Thus, the voltage $V_1$ is made equal to the reference voltage $V_0$ by the differential amplifying circuit 5. The output voltage $V_2$ of the differential amplifying circuit 5 is fed to the inverting terminal of a comparator 4 through a transfer capacity 8. Then the comparator 4 compares the input voltage $V_2$ with a reference voltage $V_{ref}$ and outputs the compared result as a binary output voltage $S_1$.

In this optical sensing circuit, light beams irradiated onto the photodiode 1 produce the photoelectric current flowing from the power voltage source $V_{DD}$ to the anode of the photodiode 1, and raise the input voltage $V_1$ of the differential amplifying circuit 5.

Figure 5:
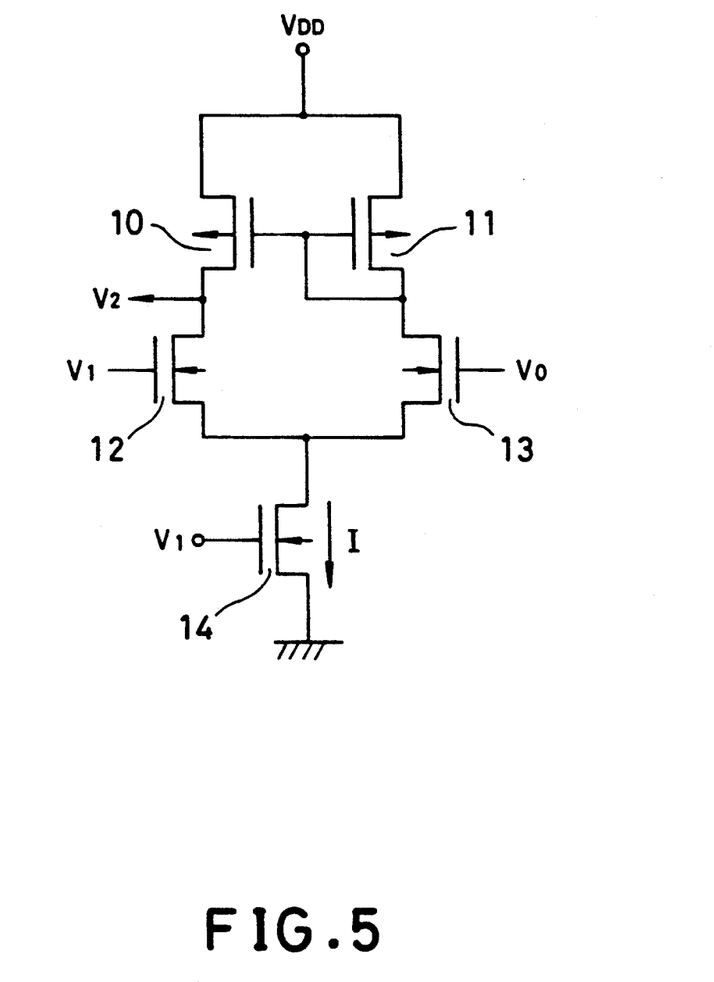
FIG. 5 is a circuit diagram showing the differential amplifying circuit of Embodiment 1.

Increasing the input voltage $V_1$ produces a difference between the reference voltage $V_0$ and the input voltage $V_1$. The difference makes the differential amplifying circuit 5 operate to generate the output voltage $V_2$ as shown in the following expression (3):

$$V_2 = A(V_1 - V_0) \ldots \tag{3}$$

where A is an amplification factor of the differential amplifying circuit 5. An example of the circuit configuration of the differential amplifying circuit is shown in FIG. 5. This circuit is well known. Between the power source voltage $V_{DD}$ and the ground potential in this circuit, p channel type MOS transistors 10 and 11 are connected in parallel, and n channel type MOS transistors 12 and 13, which form a current Miller circuit, are connected in parallel respectively, and after both the MOS transistors have been connected, an n channel MOS transistor 14 is also connected to the MOS transistors 12 and 13 as a constant-current source. The input voltage $V_1$ is input to gates of the n channel MOS transistors 12 and 14, the reference voltage $V_0$ is input to a gate of the n channel MOS transistor 13, and the output voltage $V_2$ is taken out between the p channel MOS transistor 10 and the n channel MOS transistor 12.

With respect to the output voltage $V_2$, while the input signal $S_{G1}$ is at level H and the first reset transistor 6 is turned on, the following expression (4) is satisfied:

$$V_2 = V_1 = V_0 \tag{4}$$

On the other hand, while the input signal $S_{G1}$ is at level L and the first reset transistor 6 is cut off, the following expression (5) is satisfied:

$$V_2 - V_1 = (-1/C_1) \cdot \int I \, dt \tag{5}$$

When the first reset transistor 6 is switched from the conductivity state to the cut-off state at time $t=0$, the following expression (6) is satisfied:

$$V_1(t=0) = V_0/(1 - 1/A) \tag{6}$$

when the amplification factor $A \gg 1$, $$V_1(t=0) = V_0$$

If the photoelectric current I is constant, expression (5) can be expressed as follows:

$$V_2 - V_1 = -I \cdot t / C_1 \tag{7}$$

Combining expression (3) with expression (7), the following expressions (8) and (9) can be obtained:

$$V_2 = (V_0 - I \cdot t / C_1)/(1 - 1/A) \tag{8}$$

$$V_1 = V_0 + (V_0 - I \cdot t / C_1)/(A - 1) \tag{9}$$

If $t=0$ in expression (9), expression (6) can be obtained. Moreover, if $A \gg 1$ in expressions (8) and (9), the following expressions (10) and (11) can be obtained respectively:

$$V_2 = V_0 - I \cdot t / C_1 \tag{10}$$

$$V_1 = V_0 \tag{11}$$

As is seen from expression (11), if the differential amplifying circuit 5 has a large amplification factor A, the voltage $V_1$ of the anode of the photodiode 1 is always equal to the reference voltage $V_0$. Thus, the reverse-biased voltage of the photodiode 1 is always equal to the constant value of $(V_{DD} - V_0)$. As a result, the junction capacity is neither charged nor discharged based on the photoelectric current I of the photodiode 1 during an integral action, and it is not required to consider the junction capacity of the photodiode 1 in the integral action. It is possible to make the variation of the output voltage larger by making the capacitance C1 of the integral capacity 7 far smaller than in the conventional circuit, which can improve the sensitivity of the circuit of FIG. 3 to light. Moreover, since a constant reverse-biased voltage is always applied to the photodiode 1, the operation of the photodiode 1 is stable, and consequently the intensity of light can be converted into the photoelectric current with better accuracy.

Figure 4:
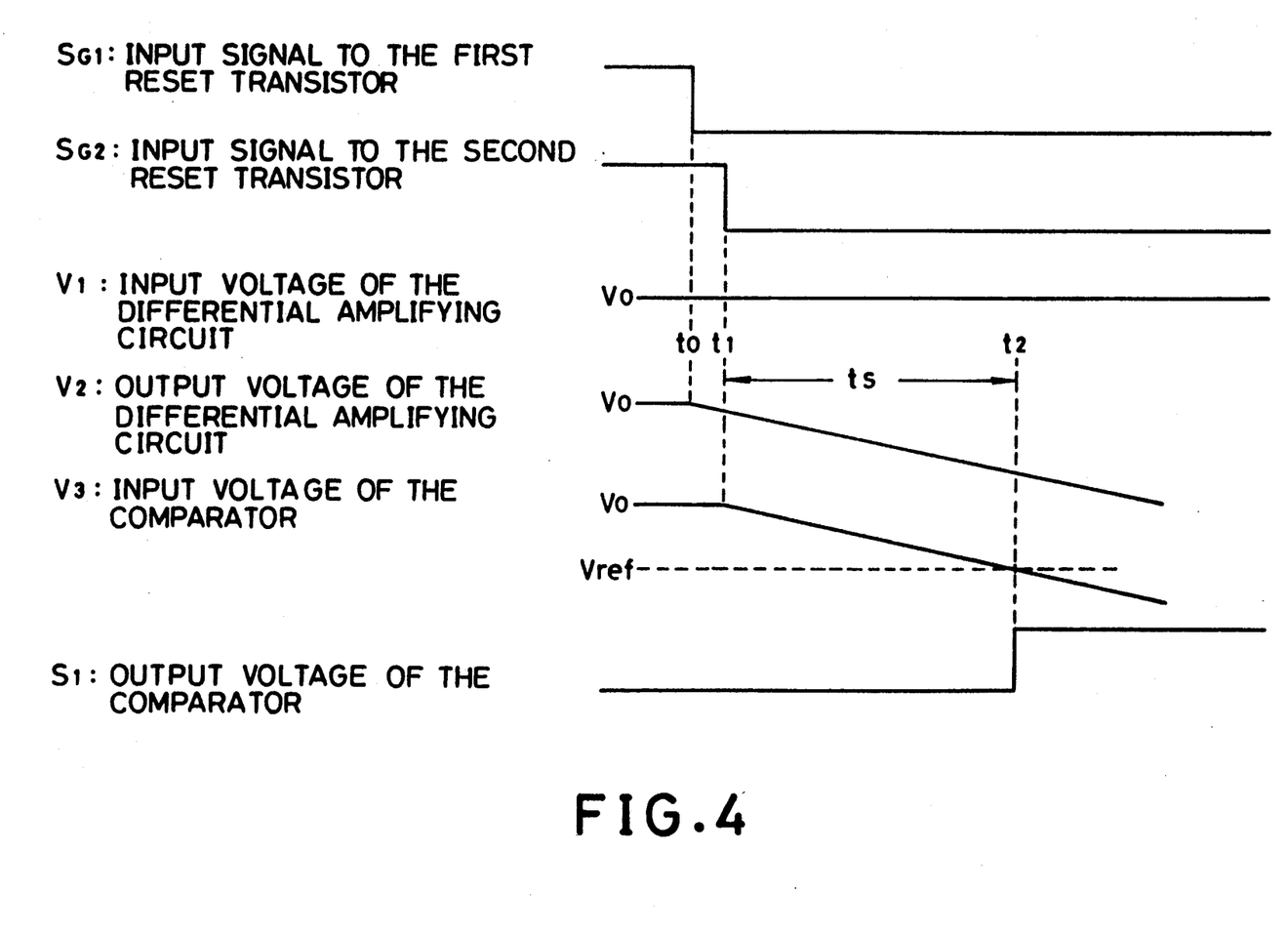
FIG. 4 is a timing chart showing the circuit operation of Embodiment 1.

The operation of the optical sensing circuit of the present invention will be described with reference to the timing chart shown in FIG. 4. First, the input signal $S_{G1}$ is set to level H so that the first reset transistor 6 is turned on, and hence the input voltage $V_1$ and the output voltage $V_2$ are set to the initial voltage $V_0$. Secondly, after the input signal $S_{G1}$ is changed to level L, and the first reset transistor 6 is cut off. Then, the input voltage $V_1$ of the differential amplifying circuit 5 tries to change based on the photoelectric current I of the photodiode 1, as shown in expression (9). The input voltage $V_1$, however, deviates only a little from the initial voltage $V_0$ because the amplification factor A is sufficiently large. The output voltage $V_2$ of the differential amplifying circuit 5 changes based on the current fed from the photodiode 1 as shown in expression (8), and decreases with the lapse of time.

At this time $t_0$, since the input signal $S_{G2}$ is at level H, the second reset transistor 9 is in the conductivity state, and the input voltage $V_3$ of the the comparator 4 is maintained at the initial voltage $V_0$. When the input signal $S_{G2}$ is turned to level L at the time $t_1$ after a predetermined time has passed from the time $t_0$, the second reset transistor 9 is cut off and the input voltage $V_3$ to the comparator 4 follows the decrease of the output voltage $V_2$ of the differential amplifying circuit 5. The change of the input voltage $V_3$ can be expressed by the following expression (12):

$$V_3 = V_0 - I \cdot t / C_1 \tag{12}$$

Before the second reset transistor 9 is cut off (time period from $t_0$ to $t_1$), the change of the output voltage $V_2$ is not transferred to the comparator 4 and only charges the capacity 8, because the input voltage $V_3$ of the comparator 4 is maintained at the initial voltage $V_0$ via the conductivity of the second reset transistor 9. Therefore, the influence of switching noise on the output voltage $V_2$ when the first reset transistor 6 is cut off, exerts no effect on the input voltage $V_3$ of the comparator 4, which enables the intensity of light to be detected with high accuracy. Moreover, the input voltage $V_3$ is not affected by the offset voltage which may reside in the differential amplifying circuit 5. Thus, fluctuation of the offset voltage of the differential amplifying circuit 5 has no effect on the sensitivity of the circuit to light. Consequently, uniformity of light sensitivity of various optical sensing circuits can be easily achieved.

If the input voltage $V_3$ decreases to the predetermined reference voltage $V_{ref}$ at the time $t_2$, the output voltage $S_1$ of the comparator 4 turns from level L to level H, and the reserve time $t_s$ (i.e., $t_s=t_2-t_1$) from the cutting off of the reset transistor 9 to the turning on of the comparator 4 can be expressed as follows:

$$t_s=(V_0-V_{ref})\cdot C_1/I \tag{13}$$

Thus, the intensity of light can be calculated by measuring the reserve time $t_s$.

In the above optical sensing circuit, the reference voltage $V_0$ fed to the non-inverting terminal of the differential amplifying circuit 5, equals the reference voltage $V_{ref}$ fed to the non-inverting terminal of the comparator 4. However, these voltages may differ from each other.

Embodiment 2

Figure 6:
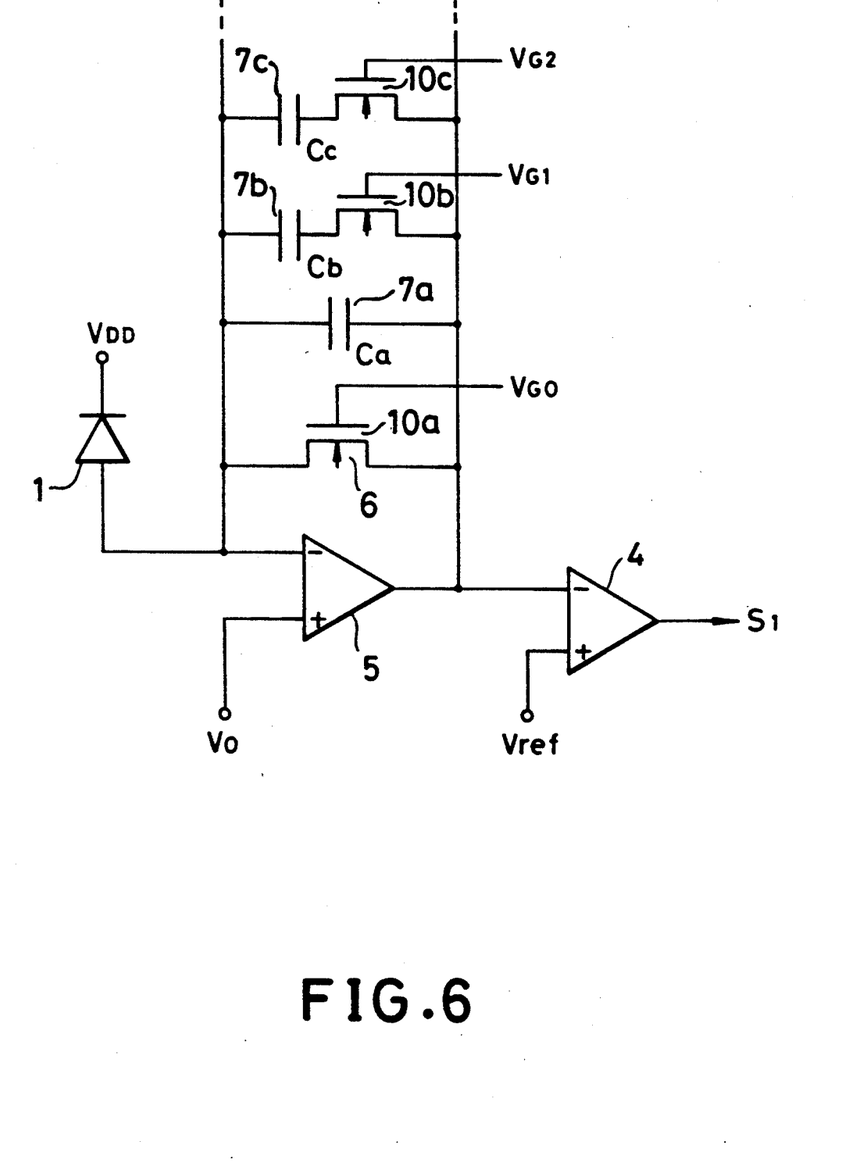
FIG. 6 is a circuit diagram showing Embodiment 2 of the optical sensing circuit of the present invention.

Embodiment 2 of the present invention will be described below with reference to FIGS. 6 and 7. As shown in FIG. 6, the capacity $C_1$ in Embodiment 1 is replaced with a parallel connection of a reference capacity 7a with capacitance $C_a$, an adjusting capacity 7b with capacitance $C_b$ serially connected to an adjusting MOS switch 10b, and an adjusting capacity 7c with a capacitance $C_c$ serially connected to an adjusting MOS switch 10c. Any number of serial connections of an adjusting capacity and an adjusting MOS switch can be connected in parallel. In this embodiment, the relationship among capacities, is set as $C_a<C_b<C_c\ldots$ Each adjusting MOS switch 10a, 10b, ... is turned on or off by changing each gate voltage $V_{G1}$, $V_{G2}$ .... Accordingly, the composite capacitance of the integral capacity can be changed to any one of a plurality of values equal to or greater than the reference capacitance $C_a$. Thus, the reverse time period $t_s$ of the output signal $S_1$ of the comparator 4 can be set to be an appropriate value according to the intensity of light irradiated onto the photodiode 1. This can prevent an inaccurate measurement due to low resolution for a reduced intensity of light.

Figure 7:
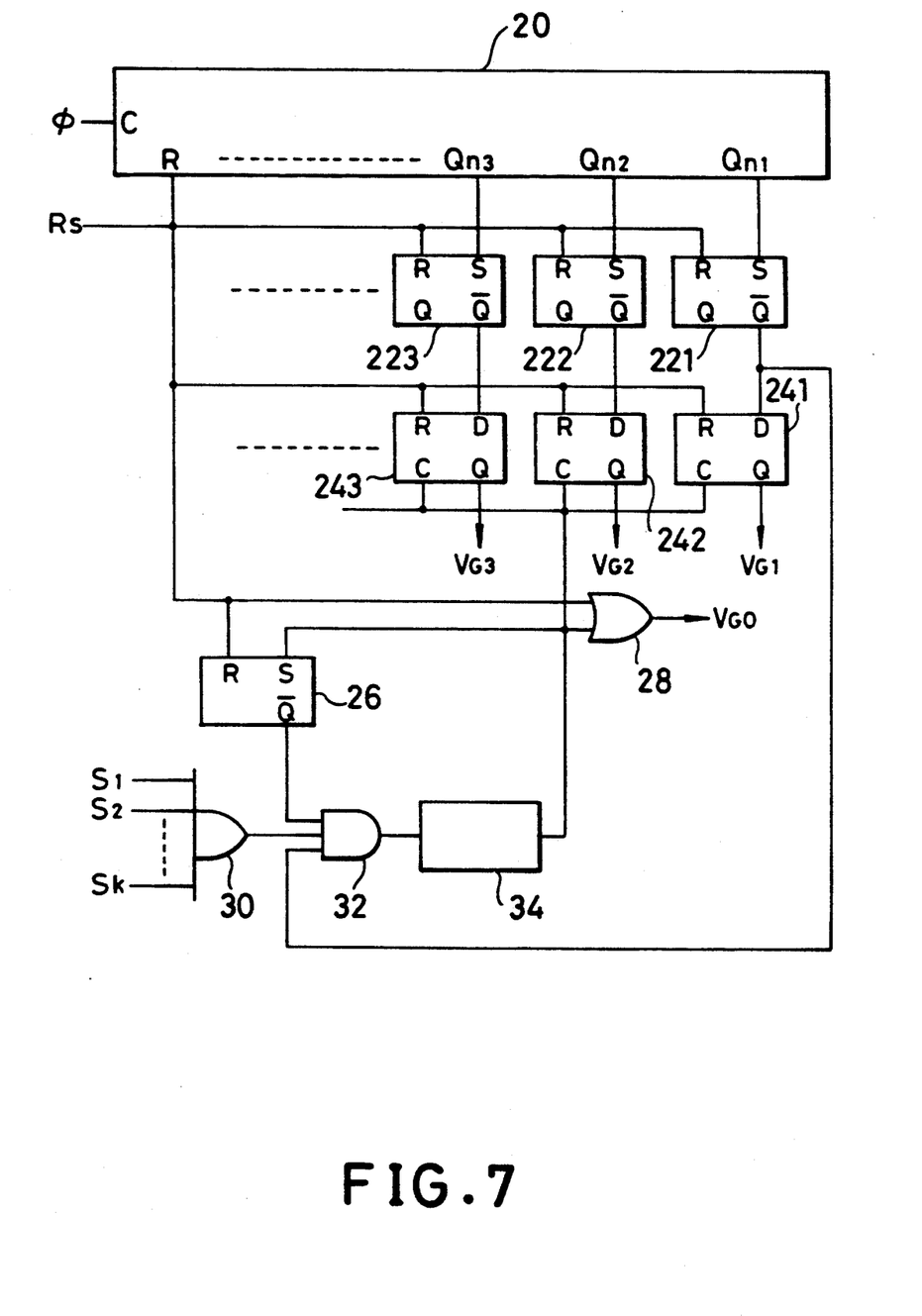
FIG. 7 is a circuit diagram showing a control circuit of a sensor array comprising a plurality of optical sensing circuits of Embodiment 2.

An example of a control circuit of each adjusting MOS switch 10a, 10b ..., is shown in FIG. 7. In this control circuit, the output signal $S_1$ of the comparator 4 shown in FIG. 6 is input thereto, and signals corresponding to the reverse time period $t_s$ of the output signal $S_1$ are fed back to the adjusting MOS switches as gate control voltages $V_{G1}$, $V_{G2}$, ....

An automatic focusing sensor array (not shown) is composed of a plurality of the optical sensing circuits in FIG. 6. In this sensor array, when light beams with a light intensity stronger than a predetermined one are irradiated from a high luminance object onto any of photodiodes 1, the reverse time period $t_s$ of the output signal $S_1$ of each optical sensing circuit is shortened to a value smaller than a predetermined time. In this case, after the composite capacitance is changed by controlling the gate voltages $V_{G1}$, $V_{G2}$, ... of the adjusting MOS switches, the measurement of the light intensity is repeated. In this control circuit, a counting circuit 20 counts reference clock signals $\phi$, and then outputs a binary code, $Q_1, Q_2, \ldots, Q_{n3}, Q_{n2}, Q_{n1}$, representing its count value. Moreover, there are provided a plurality of RS flip-flops, to which the binary code $Q_1, Q_2, \ldots, Q_{n3}, Q_{n2}, Q_{n1}$, and a system reset signal $R_3$ are input as set signals and a reset signal respectively. In FIG. 7, RS flip-flops 221, 222 and 223 are shown, to which each digit of a binary code $Q_{n1}, Q_{n2}, Q_{n3}$ is inputted respectively. The system reset signal $R_S$ is at level H for a predetermined time only at the start of the measurement, and then is maintained at level L. Inverted outputs of RS flip-flops 221, 222 and 223 are input to D flip-flops 241, 242 and 243 respectively, wherein the system reset signal $R_S$ has been inputted.

On the other hand, a plurality of output signals $S_1$, $S_2$, ..., $S_k$, from comparators 4 in the optical sensor array are input into an OR gate 30. An output signal of the OR gate 30 is input into an AND gate 32, together with an inverted output of an RS flip-flop 26 which has been reset by the system reset signal $R_s$, and the inverted output of the RS flip-flop 221. An output signal of the AND gate 32 is fed to a one-shot circuit 34. The one-shot circuit 34 outputs a signal of level H for a predetermined time period from the rise time of the output signal of the AND gate 32, and the output signal of the one-shot circuit 34 is fed both to the D flip-flops 241, 242, 243 ... as a clock signal and to the RS flip-flop 26 as a set signal, and is further fed to an OR gate 28.

In the control circuit in FIG. 7, the counting circuit 20, the RS flip-flops 221, 222, 223 ..., the D flip-flops 241, 242, 243 ..., and the RS flip-flop 26 are initially reset by the system reset signal $R_S$ incoming as an initial pulse. At the same time, a pulse is output from the OR gate 28 as a control signal $V_{G0}$ when the system reset signal $R_S$ is inputted. The control signal $V_{G0}$ cuts off the first reset transistor 6 for a predetermined time in order to initialize each circuit of the optical sensing circuit shown in FIG. 6.

Since these D flip-flops have been initially reset, the output control signals $V_{G1}$, $V_{G2}$, $V_{G3}$... of the D flip-flops 241, 242, 243 ... are maintained at level L. As a result, the adjusting MOS switches 10b and 10c are maintained in the off state and hence only the reference capacity 7a functions as an integral capacity.

In this state, an integral action of the photoelectric current of the photodiode 1 starts and in the course of this, the output signals $S_1, S_2, \ldots S_k$ of the comparators 4, are inverted as well as in Embodiment 1, after predetermined times depending on the intensity of the irradiated light. In this case, if signal $S_i$ (i=one of 1 to k) is inverted at first among the output signals of the optical sensor array, the output signal of the OR gate 30 is inverted from level L to level H, and the inverted signal is applied to the AND gate 32. In addition to this signal of the OR gate 30, an inverted output signal of the RS flip-flop 26 and the inverted output signal of the RS flip-flop 221 consisting of a shift register are also input into the AND gate 32. In the initial state, both the inverted output signals above are set at level H. Thus, when the output signal of the OR gate 30 is inverted from level L to level H, the output signal of the AND gate 32 is changed from level L to level H. Consequently, the one-shot circuit 34 of the next stage produces a pulse signal of a predetermined width. This pulse is input into the D flip-flops 241, 242, 243, ... as a clock signal. At this time, the D flip-flops 241, 242, 243, ... read the inverted output signals of the RS flip-flops 221, 222, 223, ... respectively, and output these inverted signals as the control signals $V_{G1}$, $V_{G2}$, $V_{G3}$, .... In addition, the output signal of the one-shot circuit 34 also causes the OR gate 28 to output a pulse as the control signal $V_{G0}$, which initializes the integral circuit of the photoelectric current.

On the other hand, when the reverse time period $t_s$ of the first inverted output signal $S_i$ is delayed so that output signals up to $Q_{n1}$ of the counting circuit 20 have been already set at level H, the inverted output signal of the RS flip-flop 221 has been at level L and has been input into the AND gate 32. Thus, even if the output signal $S_i$ is inverted, the output signal of the AND gate 32 is not inverted. As a result, no changes occur in the control signals $V_{G1}$, $V_{G2}$, $V_{G3}$ and $V_{G0}$, and hence the integral circuit is not initialized, and the operation of the optical sensing circuit terminates.

Since the output signal of the above one-shot circuit 34 is also fed to the set terminal of the RS flip-flop 26, the inverted output signal of the RS flip-flop 26 is changed to level L. Accordingly, even when the output signals other than $S_i$ are inverted, the output signal of the AND gate 32 is not turned to level H by the output signal of the OR gate 30, as long as the system reset signal $R_s$ is not turned to level H, and so the one-shot circuit 34 does not operate. That is, after the system reset signal $R_s$ is input, the feedback control is performed by the first inverted output signal.

When the inverted output signal $S_i$ has been input before the output signals up to $Q_{n1}$ of the counting circuit 20 are set to level H, and the control signal $V_{G0}$ restarts the measurement, a certain number of the control signals $V_{G1}$, $V_{G2}$, $V_{G3}$, ... becomes to level H, the number being determined by the reverse time period of the output signal $S_i$. These control signals are transmitted to the gates of the adjusting MOS switches 10a, 10b, ...

So, the shorter the reverse time period $t_s$ of the output signal $S_i$, the greater the composite capacity. For example, if the reverse time period $t_s$ of the output signal $S_i$ is short, the binary code in the counting circuit 20 is small. At this time, for example, the latched control signals $V_{G1}$, $V_{G2}$, $V_{G3}$, ... will be L, H, H, H, .... All the adjusting MOS switches other than 10b to which the control signal $V_{G1}$ is input, are turned on, and hence the adjusting capacity 7c, ... other than the adjusting capacity 7b are added to the reference capacity 7a, resulting in an increase in the composite capacitance, i.e., the integral capacitance. Therefore, in a subsequent measurement, the reverse time period $t_s$ of the output signal $S_i$ becomes long due to the increase in the integral capacitance. By contrast, when the reverse time period $t_s$ of the output signal $S_i$ is long, the latch time of the control signals is long and the binary code in the counting circuit 20 is large. At this time, for example, the control signals $V_{G1}$, $V_{G2}$, $V_{G3}$, ... will be L, L, L, H, .... Therefore, the adjusting MOS switches 10b, 10c and 10d are cut off, and an increase in the integral capacity is less than the increase in the above case. Thus, in a subsequent measurement, the reverse time period $t_s$ of the output signal $S_i$ is not so long as that in the above case.

When the control circuit shown in FIG. 7 is provided, the integral action of the photoelectric current for a normal light intensity is performed by using only the reference capacity 7a. On the other hand, if the reverse time period of the output signal $S_i$ is short, and the intensity of light is so strong as to cause an insufficient resolution in the measurement, the optical sensing circuit is reset again and the integral action of the photoelectric current is performed again by using the composite capacity corresponding to this light intensity.

Figure 8:
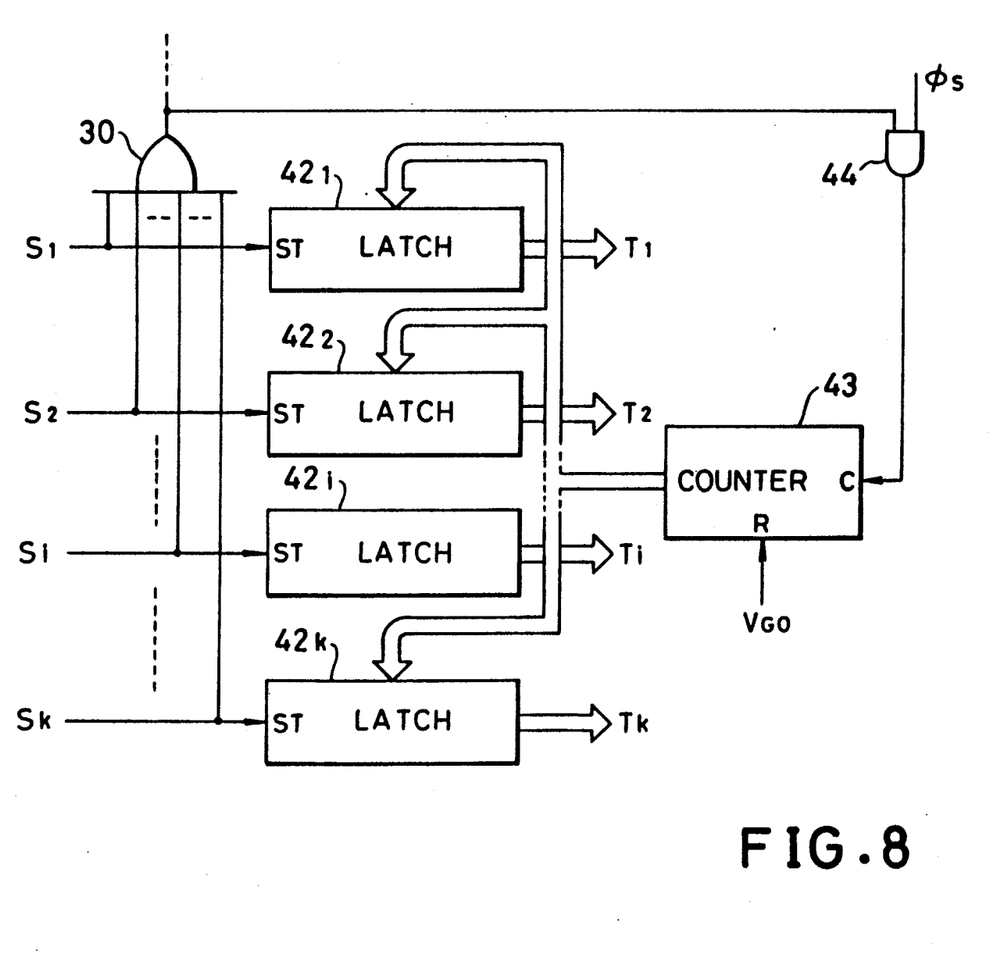
FIG. 8 is a circuit diagram showing a circuit which quantizes the reserve time of each output signal of the sensor array.

In these cases, the output signals $S_1$, $S_2$, ..., $S_k$ of the sensor array obtained by the integral action of the photoelectric current, are input into not only the OR gate 30 shown in FIG. 7, but also latch circuits $42_1$, $42_2$, ..., $42_k$ shown in FIG. 8, as strobe signals. In FIG. 8, the output signal of the OR gate 30 and the clock signal $\phi_s$ are applied to an AND gate 44, which in turn feeds its output signal to a counter 43 as a clock signal. The count value in the counter 43 is input into the latch circuits $42_1$, $42_2$, ..., $42_k$. When the output signal $S_i$ is inverted first, the output signal of the OR gate 30 is also inverted, and then the AND gate 44 starts outputting the clock signals $\phi_s$. The counter 43, which has been reset by the control signal $V_{G0}$, counts the clock signals $\phi_s$, and transfers its count value to the latch circuits $42_1$, $42_2$, ..., $42_k$. The latch circuit $42_i$, to which the output signal $S_i$ is applied, latches the output signal of the counter 43 in the reset state. Accordingly, the output signal Ti of the latch circuit $42_i$ is zero, while the other latch circuits $42_1$, $42_2$, ..., $42_k$ latch the output signal of the counter 43 when the output signals $S_1$, $S_2$, ..., $S_k$ are inverted respectively. As a result, each reverse time period of the output signals $S_1$, $S_2$, ..., $S_k$ is quantized using the first inverted output signal $S_i$ as a reference. It is also possible to start the counter 43 when the control signal $V_{G0}$ is applied thereto, without the intermediary of the AND gate 44. However, in the embodiment of the present invention, the dynamic range of the sensor array for the intensity of light is enlarged by quantizing each reverse time period of the output signals $S_1$, $S_2$, ..., $S_k$ by using the reverse time period of the first output signal $S_i$ as a reference. This sensor array, when used as an optical detecting portion for automatic focusing, makes it possible to determine a positional deviation between two subjects formed on the sensor array by measuring each quantized reverse time period of the output signals $S_1$, $S_2$, ..., $S_k$. The distance to the subject can be calculated by using the above positional deviation. In Embodiment 2 of the present invention, the intensity of light is judged on the basis of the shortest reverse time period of the output signal $S_i$ among the output signals $S_1$, $S_2$, ..., $S_k$ of the sensor array. For the normal intensity of light, each photoelectric current in the sensor array is integrated by using the reference capacity 7a. On the other hand, for a strong intensity of light, the composite integral capacitance is increased according to the intensity of light, and then the light intensity is measured again. Thus, the reverse time period can be set longer than a predetermined time for any light intensity to be measured, and hence, the detection accuracy can be achieved automatically for a wide range of the light intensity. Accordingly, the dynamic range for light intensities can be enlarged both as the single optical sensing circuit and as the entire sensor array.

The reference capacity 7a, capacitance values and the number of the adjusting capacities can be set to appropriate values in order to optimize the detection of the light intensity. The reference clock frequency $\phi$ can be selected for an appropriate value in order to achieve high accuracy of detection of the light intensity.

Embodiment 3

Figure 9:
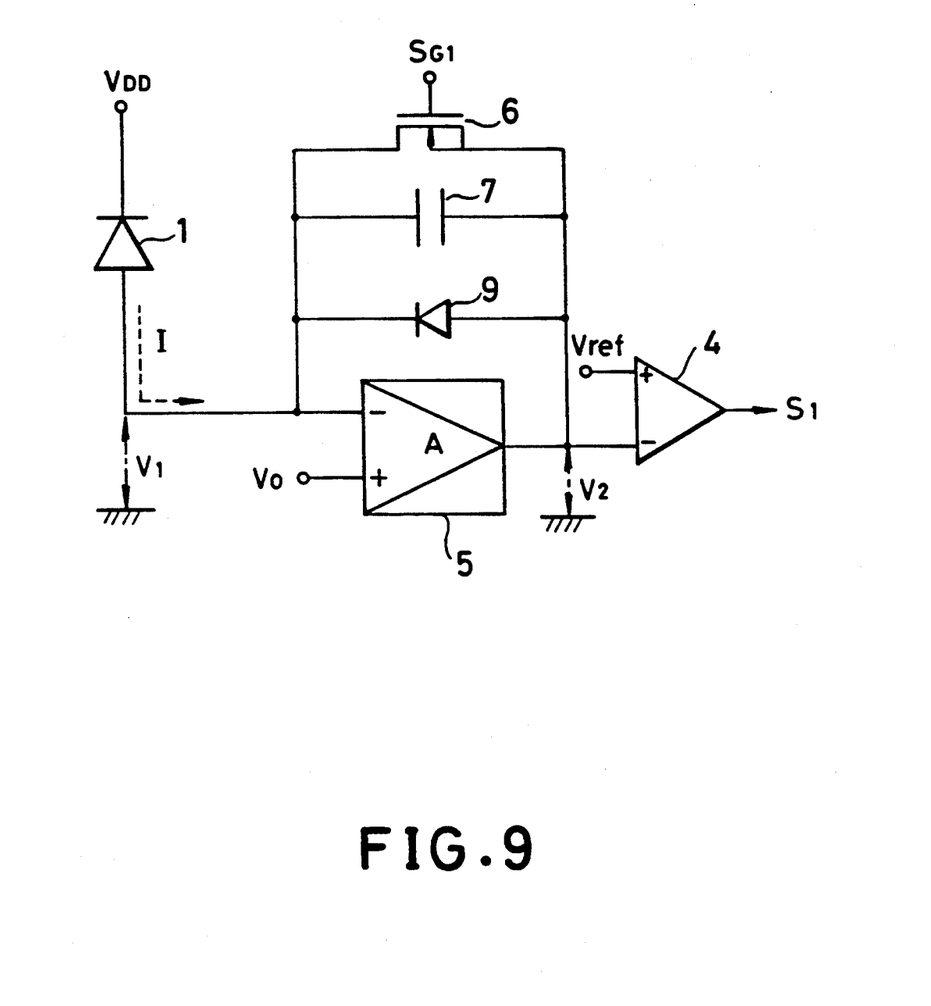
FIG. 9 is a circuit diagram showing Embodiment 3 of the optical sensing circuit of the present invention.
Figure 10:
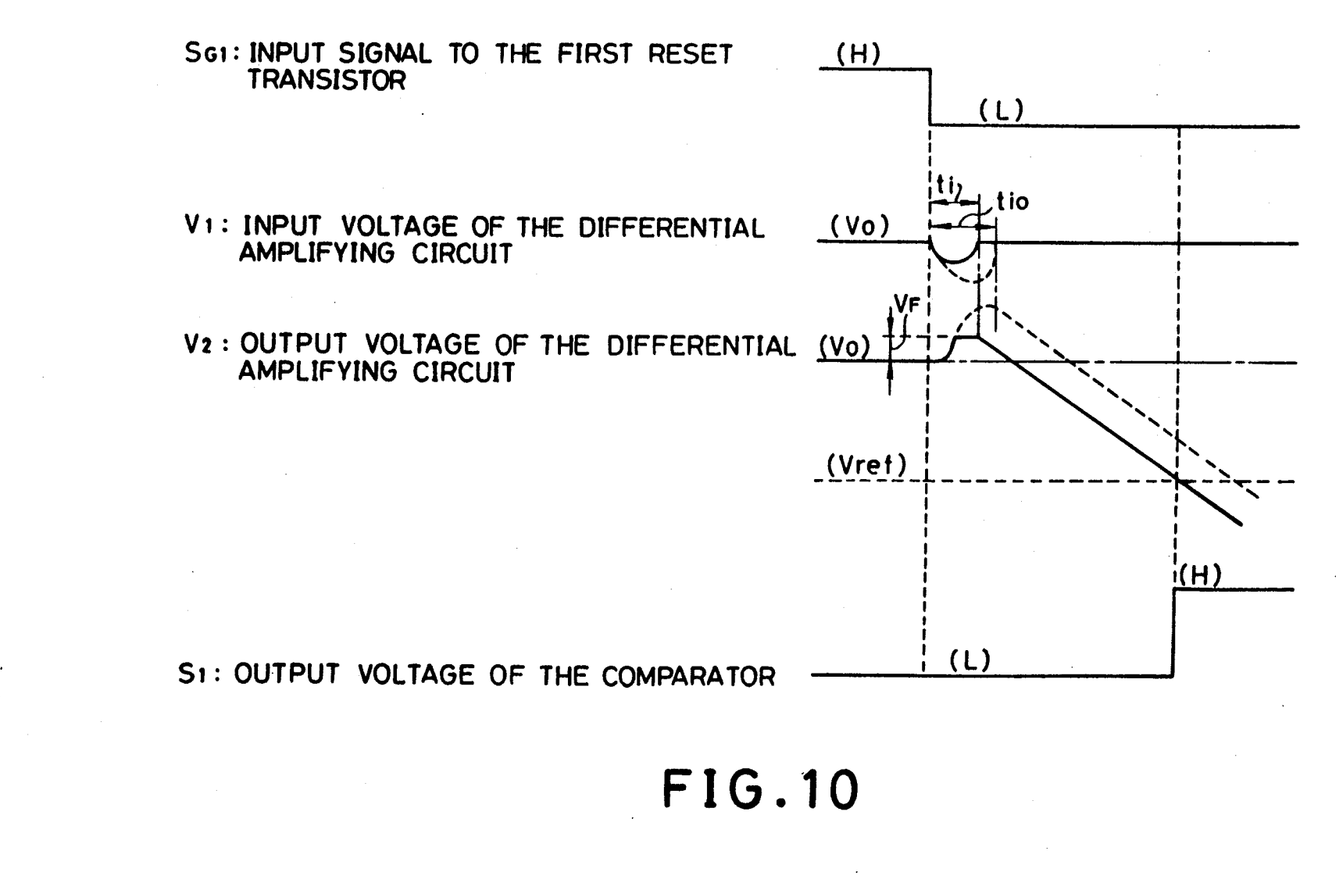
FIG. 10 is a timing chart showing the circuit operation of Embodiment 3.
Figure 11:
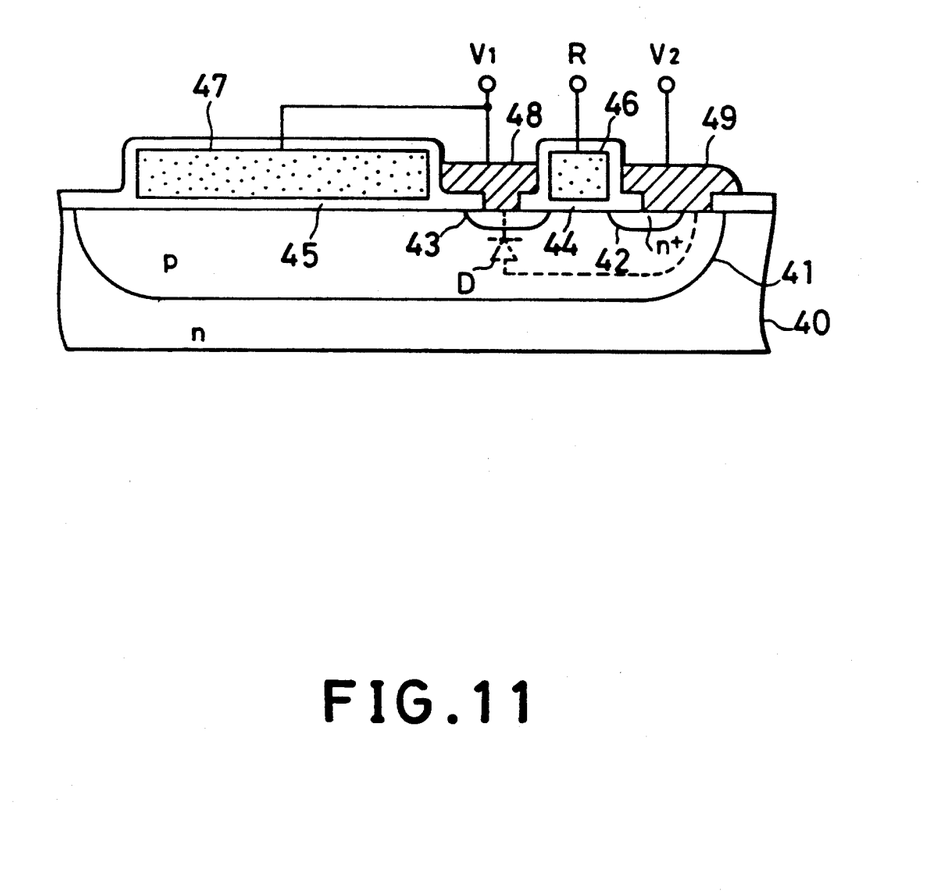
FIG. 11 is a longitudinal sectional view showing the configuration of a semiconductor element where a first reset transistor and an integral capacity are formed in parallel.

With reference to FIGS. 9-11, Embodiment 3 of the present invention will be described.

As shown in FIG. 9, in Embodiment 3, a photodiode 1, a differential amplifying circuit 5, an integral capacity 7, a first reset transistor 6 and a comparator 4 are connected as in the optical sensing circuit of Embodiment 1 shown in FIG. 3. A diode 9 is further connected across the differential amplifying circuit 5. The anode voltage of the photodiode 1 is applied to the inverting terminal of the differential amplifying circuit 5. This avoids an oscillation of the output voltage caused by initial instability of an amplification factor A of the differential amplification circuit 5.

With reference to FIG. 10, the operation of this optical sensing circuit will be described below. The input signal $S_{G1}$ to the first reset transistor 6 is switched from level H to level L so as to cut off the transistor 6. In this case, it is ideal that the input voltage $V_1$ of the differential amplifying circuit 5 is maintained at a constant voltage and the output voltage $V_2$ thereof decreases according to the intensity of light. Actually, however, the input voltage $V_1$ and the output voltage $V_2$ fluctuate because the voltage of the input signal $S_{G1}$ varies via a capacity between the gate and the drain and a capacity between the gate and the source of the first reset transistor 6. If the output impedance of the differential amplifying circuit 5 is small, the change in the output voltage $V_2$ is negligible. Actually, however, the input impedance of the differential amplifying circuit 5 is usually large, which causes the input voltage $V_1$ to be decreased. Consequently, a decrease in the input voltage $V_1$ causes a change in the output voltage $V_2$, and hence the voltage $V_2$ is unstable until a virtual ground(virtual short) between the input voltage $V_1$ and the reference voltage $V_0$ is recovered. This state is shown in FIG. 10, and dotted lines therein indicate an initial variation in the input voltage $V_1$ and the output voltage $V_2$ when the diode 9 shown in FIG. 9 is not connected. A stability time period $t_{i0}$ of the voltages $V_1$ and $V_2$ is usually 1 to 2 microseconds. However, since switching noise occurs and the amplification factor A of each differential amplifying circuit 5 and other features differ, the stability time period $t_{i0}$ fluctuates for each measurement or for each optical sensing circuit.

When the output voltage $V_2$ rises, a current flows from the output to the input of the differential amplifying circuit 5 through the diode 9. This limits the voltage rise to a forward voltage drop $V_F$ of the diode 9 (about 0.6 volt). Because of this clamping effect, the actual deviation of the initial output voltage $V_2$ is limited to $V_F$. Owing to the feedback of an output current, the stability time period of the differential amplifying circuit 5 is shortened to a time period $t_i$ as shown in FIG. 10.

The suppression of the deviation of the initial voltage enables the accuracy of the reverse time period of the comparator 4 to be improved, thereby achieving a high accuracy of the measurement of the intensity of light. If the transfer capacity 8 and the second reset transistor 9 are inserted in the previous stage of the comparator 4 as in Embodiment 1 shown in FIG. 3, the switching time period between the input signal $S_{G1}$ of the first reset transistor 6 and the input signal $S_{G2}$ of the second reset transistor 9, can be shortened. Even in this case, the reduction in the stability time period of the differential amplifying circuit 5 can also solve the following problem even if the intensity of light is extremely strong. The problem is that the switching time period between the two input signals cannot be secured, and hence the measurement of the light intensity becomes impossible, because the reverse time period of the comparator 4 is smaller than the stability time period of the differential amplifying circuit 5. Moreover, the deviation of the initial output voltage $V_2$ is limited to the constant voltage $V_F$. This prevents unevenness of the stability time period of the differential amplifying circuit 5, which is caused by the switching noise and circuit characteristics. More specifically, when the intensity of light is simultaneously measured by using a plurality of optical sensing circuits in the sensor array, the uniformity of the measurement can be improved, high accuracy of the light intensity distribution in the measurement can be achieved, and yield in manufacturing the optical sensing circuits can also be improved. In the initial state when the differential amplifying circuit 5 starts an integral action, features of the differential amplifying circuit 5 are unstable and oscillations may be induced in the circuit. In Embodiment 3, since the diode 9 is connected between the input and output terminals of the differential amplifying circuit 5, the oscillations can be prevented.

As shown in FIG. 11, when the optical sensing circuit of Embodiment 3 is formed on a semiconductor substrate 40, the first reset transistor 6 and the integral capacity 7 are formed in a surface of a p type island 41. On the surface of the p type island 41, a gate insulating film 44 and a capacity insulating film 45 are simultaneously formed, and a gate electrode 46 on the gate insulating film 44 and a capacity electrode 47 on the capacity insulating film 45 are formed by a polysilicon deposition process called CVD (chemical vapor deposition) method. Then, an n+ type source region 42 and an n+ type drain region 43 are diffused by self-alignment process by using the gate electrode 46 as a mask. A drain electrode 48, which is electrically connected to the capacity electrode 47 and is made of aluminum, is formed on the drain region 43, while a source electrode 49, which is electrically connected to the source region 42 and the island 41, is made of aluminum.

Thus, a semiconductor element is formed, wherein the first reset transistor 6 of an n channel type MOS-FET (MOS field effect transistor) and the integral capacity 7 are connected in parallel. A diode D, which is indicated in dotted lines in FIG. 11, is formed between the drain electrode 48 and the source electrode 49, and is used as the diode 9 in FIG. 9. Therefore, this semiconductor element enables the optical sensing circuit of Embodiment 3 to be formed in a small area and at a low cost.

The invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An optical sensing circuit comprising:
  photoelectric current generating means for converting light beams into a photoelectric current;
  current-to-voltage converting means for converting said photoelectric current into a voltage, said current-to-voltage converting means including:
    a differential amplifying circuit which receives at an input terminal said photoelectric current and generates at an output terminal an output voltage; and
    an integral capacity connected between the input and output terminals of said differential amplifying circuit;

voltage comparing means for comparing an amplitude of the output voltage of said current-to-voltage converting means with a reference voltage;

switching means connected between the input and output terminals of said differential amplifying circuit, said switching means being turned from on to off to produce a change in the output voltage of said differential amplifying circuit corresponding to said photoelectric current;

a transfer capacity inserted between the output terminal of said differential amplifying circuit and an input terminal of said voltage comparing means; and voltage setting means connected to the input terminal of said voltage comparing means, said voltage setting means being turned from on to off a predetermined interval after said switching means is turned off thereby initializing an input voltage to said voltage comparing means by coupling the output voltage of said differential amplifying circuit to the input terminal of said voltage comparing means.

2. An optical sensing circuit as claimed in claim 1 wherein said integral capacity comprises at least one reference capacity and one or more adjusting capacities to be connected to or disconnected from the differential amplifying circuit; and wherein said optical sensing circuit further comprises control means for determining whether or not a measurement of intensity of the light beams is to be performed again based on a variation rate of the output voltage of said current-to-voltage converting means, said control means connecting or disconnecting said one or more adjusting capacities according to said variation rate when the measurement is to be performed again.

3. An optical sensing circuit as claimed in claim 1, further comprising voltage variation limiting means for limiting an initial variation of said output voltage of said differential amplifying circuit, the initial variation being defined as a voltage variation immediately after said switching means is cut off.

4. An optical sensing circuit as claimed in claim 3, wherein said voltage variation limiting means is composed of a diode which is connected between the input and output terminals of said differential amplifying circuit in a reverse-biased direction during an integral action.

5. An optical sensing circuit comprising:
photoelectric current generating means for converting light beams into a photoelectric current;
current-to-voltage converting means for converting said photoelectric current into a voltage, said current-to-voltage converting means including:
a differential amplifying circuit which receives at an input terminal said photoelectric current and generates at an output terminal an output voltage; and
an integral capacity connected between the input and output terminals of said differential amplifying circuit, said integral capacity comprising at least one reference capacity and one or more adjusting capacities to be connected to or disconnected from the differential amplifying circuit;

voltage comparing means for comparing an amplitude of the output voltage of said current-to-voltage converting means with a reference voltage;
switching means connected between the input and output terminals of said differential amplifying circuit; and
control means for determining whether or not a measurement of intensity of the light beams is to be performed again based on a variation rate of the output voltage of said current-to-voltage converting means, and for connecting or disconnecting said one or more adjusting capacities according to said variation rate when the measurement is to be performed again.

6. An optical sensing circuit comprising:
photoelectric current generating means for converting light beams into a photoelectric current;
current-to-voltage converting means for converting said photoelectric current into a voltage, said current-to-voltage converting means including:
a differential amplifying circuit which receives at an input terminal said photoelectric current and generates at an output terminal an output voltage; and
an integral capacity connected between the input and output terminals of said differential amplifying circuit;

voltage comparing means for comparing an amplitude of the output voltage of said current-to-voltage converting means with a reference voltage;
switching means connected between the input and output terminals of said differential amplifying circuit; and
voltage variation limiting means for limiting an initial variation of the output voltage of said differential amplifying circuit, the initial variation being defined as a voltage variation immediately after said switching means is cut off, said voltage variation limiting means being composed of a diode connected between the input and output terminals of said differential amplifying circuit in a reverse-biased direction during an integral action; and wherein
said switching means comprises a transistor element having:
a substrate of a first conductivity type semiconductor;
a first region of a second conductivity type semiconductor formed in the substrate;
a second region of the first conductivity type semiconductor formed in a surface of the first region;
a third region of the first conductivity type semiconductor formed in a surface of the first region; and
a channel formed in the surface of the first region between the second region and the third region; and wherein
said integral capacity comprises:
a first electrode composed of said first region;
a second electrode formed on the surface of said first region; and
a dielectric layer disposed between said first electrode and said second electrode; and wherein
said diode is a junction between said first region and said second region.

* * * * *